(12) United States Patent
Joshi et al.

(10) Patent No.: US 10,043,731 B2
(45) Date of Patent: Aug. 7, 2018

(54) MULTI-STEP PROCESSES FOR HIGH TEMPERATURE BONDING AND BONDED SUBSTRATES FORMED THEREFROM

(71) Applicant: Toyota Motor Engineering & Manufacturing North America, Inc., Erlanger, KY (US)

(72) Inventors: Shailesh N. Joshi, Ann Arbor, MI (US); Masao Noguchi, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 330 days.

(21) Appl. No.: 14/841,841

(22) Filed: Sep. 1, 2015

(65) Prior Publication Data

US 2017/0062304 A1 Mar. 2, 2017

(51) Int. Cl.
*B23K 1/00* (2006.01)
*H01L 23/373* (2006.01)
(Continued)

(52) U.S. Cl.
CPC ............ *H01L 23/3735* (2013.01); *B23K 1/19* (2013.01); *B23K 1/20* (2013.01); *H01L 23/3736* (2013.01); *H01L 23/488* (2013.01); *H01L 24/00* (2013.01); *H01L 24/32* (2013.01); *H01L 24/83* (2013.01); *H01L 25/50* (2013.01); *H01L 25/074* (2013.01); *H01L 2224/27332* (2013.01); *H01L 2224/2919* (2013.01); *H01L 2224/29111* (2013.01); *H01L 2224/32145* (2013.01); *H01L 2224/32245* (2013.01); *H01L 2224/32503* (2013.01); *H01L 2224/831* (2013.01); *H01L 2224/832* (2013.01); *H01L 2224/8382* (2013.01); *H01L 2224/83801* (2013.01); *H01L 2225/06513* (2013.01); *H01L 2924/014* (2013.01); *H01L 2924/01013* (2013.01); *H01L 2924/01028* (2013.01); *H01L 2924/01029* (2013.01); *H01L 2924/01047* (2013.01); *H01L 2924/10253* (2013.01); *H01L 2924/10272* (2013.01);
(Continued)

(58) Field of Classification Search
CPC .................... B23K 35/262; B23K 35/0244
USPC .................. 228/56.3, 193, 246, 248.1
See application file for complete search history.

(56) References Cited

U.S. PATENT DOCUMENTS 8,012,865 B2   9/2011  Mehrotra
8,348,139 B2   1/2013  Liu et al.
(Continued)

*Primary Examiner* — Erin B Saad
(74) *Attorney, Agent, or Firm* — Dinsmore & Shohl LLP

(57) ABSTRACT

A method for high temperature bonding of substrates may include providing a top substrate and a bottom substrate, and positioning an insert between the substrates to form a assembly. The insert may be shaped to hold at least an amount of Sn having a low melting temperature and a gap shaped to hold at least a plurality of metal particles having a high melting temperature greater than the low melting temperature. The assembly may be heated to below the low melting temperature and held for a first period of time. The assembly may further be heated to approximately the low melting temperature and held for a period of time at a temperature equal to or greater than the low melting temperature such that the amount of Sn and the amount of metal particles form one or more intermetallic bonds. The assembly may be cooled to create a bonded assembly.

16 Claims, 14 Drawing Sheets

(51) Int. Cl.
  *B23K 1/20* (2006.01)
  *B23K 1/19* (2006.01)
  *H01L 23/00* (2006.01)
  *H01L 23/488* (2006.01)
  *H01L 25/00* (2006.01)
  *H01L 25/07* (2006.01)

(52) U.S. Cl.
  CPC .......... *H01L 2924/2064* (2013.01); *H01L 2924/20105* (2013.01); *H01L 2924/20107* (2013.01); *H01L 2924/20108* (2013.01); *H01L 2924/20641* (2013.01); *H01L 2924/20642* (2013.01)

(56) References Cited

U.S. PATENT DOCUMENTS

| | | | |
|---|---|---|---|
| 8,673,762 B2 * | 3/2014 | Akamatsu | B23K 35/0244 257/772 |
| 8,742,600 B2 | 6/2014 | Chang et al. | |
| 8,803,001 B2 * | 8/2014 | Yoon | B23K 35/262 174/259 |
| 2007/0152026 A1 | 7/2007 | Suh et al. | |
| 2014/0079472 A1 | 3/2014 | Oppermann et al. | |

* cited by examiner

MULTI-STEP PROCESSES FOR HIGH TEMPERATURE BONDING AND BONDED SUBSTRATES FORMED THEREFROM

TECHNICAL FIELD

The present specification generally relates to methods and apparatuses for high temperature bonding and substrates formed therefrom and, more specifically, methods and apparatuses for high temperature bonding applying multi-step heating processes to at least a pair of substrates to form a strengthened bond layer.

BACKGROUND

Power semiconductor devices, such as those fabricated from SiC (silicon carbide), may be designed to operate at very high operating temperatures (e.g., greater than 250° C.). Such power semiconductor devices may be bonded to a cooling device, such as a heat sink or a liquid cooling assembly, for example. The cooling device removes heat from the power semiconductor device to ensure that it operates at a temperature that is below its maximum operating temperature. The bonding layer that bonds the power semiconductor device to the cooling device must be able to withstand the high operating temperatures of the power semiconductor device.

Transient liquid phase (TLP) or diffusion bonding or soldering are methods of high temperature bonding that may be applied. For example, TLP bonding results in a bond layer having a high temperature melting point. A typical TLP bond consists of two different material compounds: a metallic layer and an intermetallic layer or alloy. Generally, the intermetallic layer is formed during an initial melting phase wherein a low melting temperature material, such as tin, diffuses into high melting temperature materials, such as copper or nickel. Although the intermetallic alloy has a high re-melting temperature, conventional processes use tin along with paste including metal particles such as copper or nickel and apply a direct, one-step heating. The assembly is heated to a temperature that is, for example, a low melting point of tin. However, with such one-step heating, the paste impedes the path of the formed tin solder and prevents the solder from more fully coating other metal particles, which may result in a weaker bond layer.

Accordingly, a need exists for alternative methods for high temperature bonding of substrates for forming a strengthened bonding layer between a pair of substrates.

SUMMARY

In one embodiment, a method for high temperature bonding of substrates includes providing a top substrate and a bottom substrate and positioning an insert between the top and bottom substrates to form a assembly. The insert is positioned around at least a portion of the top substrate and includes at least one of a porous material and one or more channels. The insert includes a gap shaped to be disposed between the top and bottom substrates and that is shaped to hold at least an amount of a plurality of metal particles having a high melting temperature. At least one of the insert and the gap is configured to hold at least an amount of tin (Sn) having a low melting temperature, and the high melting temperature is greater than the low melting temperature. The method includes heating the assembly during a first heating to a first temperature that is below the low melting temperature, holding the assembly at the first temperature for a first period of time, and heating the assembly during a second heating to a second temperature that is approximately equal to the low melting temperature. The method further includes holding the assembly at a holding temperature for a second period of time such that the amount of Sn and the amount of metal particles form one or more intermetallic bonds, wherein the holding temperature is equal to or greater than the second temperature, and cooling the assembly to create a bonded assembly.

In another embodiment, a bonding assembly includes a bonding assembly including a top substrate, a bottom substrate, and an insert. The top substrate includes one of SiC or silicon (Si). The bottom substrate includes one of direct bonded copper substrate or direct bonded aluminum substrate. The insert includes at least one of a porous material and one or more channels. The insert is disposable between the top substrate and the bottom substrate to form a bond layer and disposable around at least a portion of the top substrate. The insert includes a gap disposed between two adjacent surfaces of the top and bottom substrates. The insert is utilized to hold at least an amount of Sn having a low melting temperature and an amount of a plurality of metal particles having a high melting temperature. The high melting temperature is greater than the low melting temperature.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
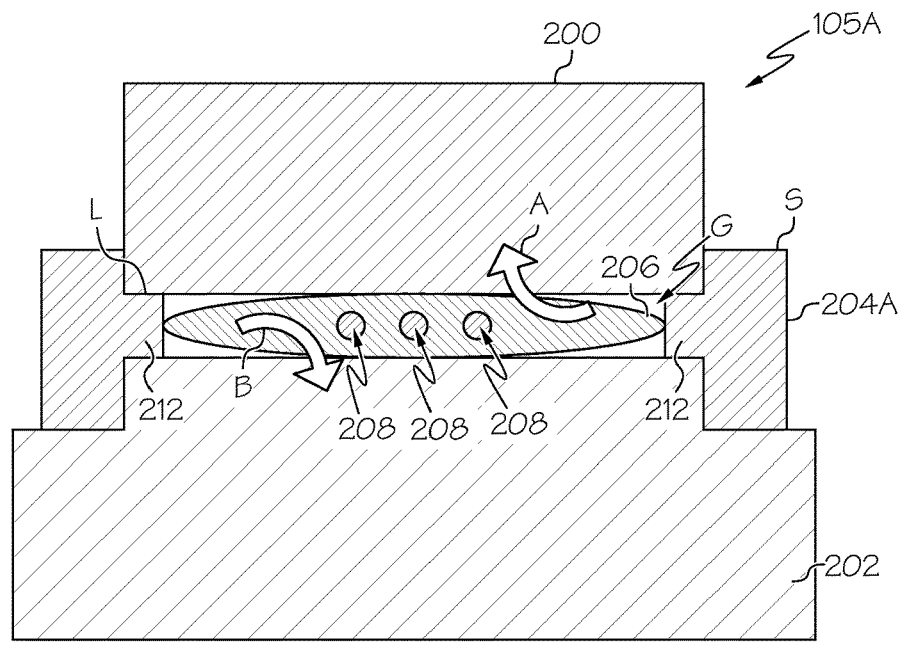
FIG. 1A schematically depicts a first bonding assembly prior to forming a bond layer between a pair of substrates per the method of FIG. 1, according to one or more embodiments shown and described herein.

Referring generally to the figures, embodiments of the present disclosure are directed to methods and apparatuses for high temperature bonding of substrates. The methods include providing a pair of substrates and positioning an insert holding tin (Sn) and a plurality of metal particles in a gap therebetween to form a assembly. The insert may be porous and/or may include one or more channels. The Sn has a low melting temperature, and the plurality of metal particles have a greater high melting temperature. Further, paste may be positioned between the two substrates. The paste may include an organic binder that includes the metal particles. A first heating step brings the assembly to a temperature below the low melting temperature and is held at this temperature for a period of time. During the first heating step, paste that was present between the two substrates may be evaporated or vaporized. Any evaporated or vaporized paste may be exhausted from the assembly through, for example, the porous pathways or channels of the insert. The methods further include a second heating step to a temperature approximately equal to the low melting temperature and a second holding step. During the second heating step, tin is drawn into the forming bond layer between the substrates via a capillary force to wet the metal particles and is consumed into the bond layer. During the second holding step at a temperature equal to or greater than the low melting temperature, one or more intermetallic bonds may be formed. Because the paste was vaporized during the first heating step, the formation of intermetallic bonds is not impeded by residual paste. The methods include cooling the assembly to create a bonded assembly having a bond layer that bonds the substrates.

As stated above, processes described herein provide for the advantages of creating a stronger bond layer over a conventional one-step heating method for high temperature bonding of substrates. The evaporation of paste during the first heating step creates a less impeded path (which causes a better wetting of particles than a more impeded path would permit) for the formation of intermetallic bonds during the second heating step because it provides for a better wetting of particles. This less impeded path may provide for a stronger bond layer over one that would be formed in a case where the paste was not fully evaporated or vaporized. Such an at least two-step heating process as described herein may additionally provide for the strengthening of the bond layer in applications where paste is not utilized to contain the metal particles such as in instances where a powder including metal particles is utilized. For example, the metal particles may be provided in a powder.

Various embodiments of methods for high temperature bonding of substrates and substrates formed therefrom are described in detail herein. Although example methods for high temperature bonding of substrates are described in the context of power electronics applications (e.g., to bond a power semiconductor device to a cooling assembly in an inverter circuit of hybrid or electric vehicles), the use of methods described herein is not limited thereto. For example, example methods and substrates formed therefrom that are described herein may be implemented in other semiconductor use applications and other applications to bond two components together.

Figure 8:
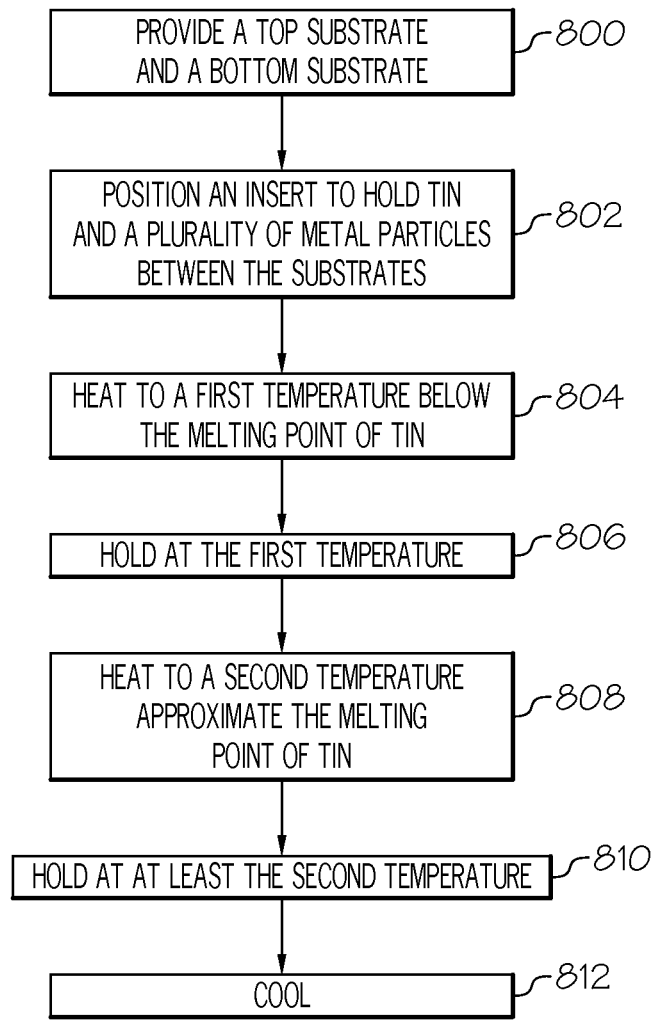
FIG. 8 depicts a flow chart of a multi-step method for high temperature bonding of substrates, according to one or more embodiments shown and described herein.

FIG. 1A illustrates a schematic of an example bonding assembly assembled, and FIG. 8 illustrates an example method for high temperature bonding of substrates utilizing, for example, the bonding assembly of FIG. 1A. Referring to FIGS. 1A and 8, a top substrate 200 and a bottom substrate 202 is provided as set forth within block 800 of FIG. 8. The top substrate 200 includes a die that is made of Si (silicon), SiC (silicon carbide), or the like. The bottom substrate 202 includes direct bonded copper, direct bonded aluminum, or the like.

As set forth in block 802 of FIG. 8, and as shown in FIG. 1A, an insert 204A is positioned between the top substrate 200 and the bottom substrate 202 to form a assembly 105A. The insert 204A is positioned around at least a portion the top substrate 200. For example, FIG. 1A shows the insert 204A positioned around a lower portion of an exterior perimeter surface of the top substrate 200. The insert 204A is made of a material capable of withstanding the melting temperatures described herein, such as a graphite, stainless steel, or a like suitable material. In some embodiments, the insert 204A may be made of a porous material, such as, without limitation, porous copper. The insert 204A may be circular or another shape that is configured to match the portion of the top substrate 200 that it surrounds. In some embodiments, the insert 204A may include one or more channels to allow for a paste evaporation pathway, as described in more detail below. The channels may be provided by the porous structure, or by dedicated channels within the insert.

As a non-limiting example, the insert 204A may include a thickness in the range of about 1 mm to 2 mm. The insert 204A defines a gap G that is shaped to be disposed between the top substrate 200 and the bottom substrate 202. In the illustrated embodiment, the gap G is shaped to hold at least an amount of a plurality of metal particles, such as metal particles 208 shown in FIG. 1A. The gap G also holds at least an amount of tin (Sn), such as tin 206 shown in FIG. 1A. Additionally or alternatively, the insert 204A may be made of a porous material that may hold tin 206.

Figure 2:
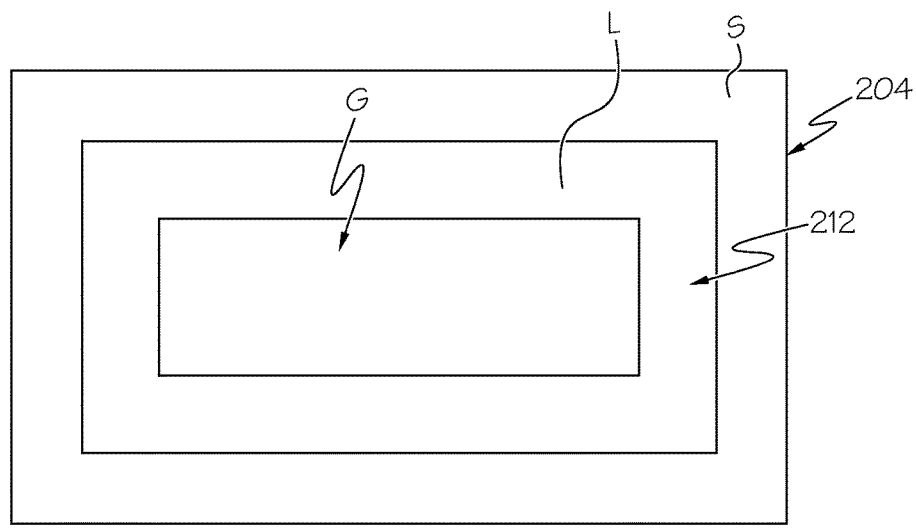
FIG. 2 schematically depicts a top plan view of an example insert of the first bonding assembly of FIG. 1A, according to one or more embodiments shown and described herein.
Figure 3:
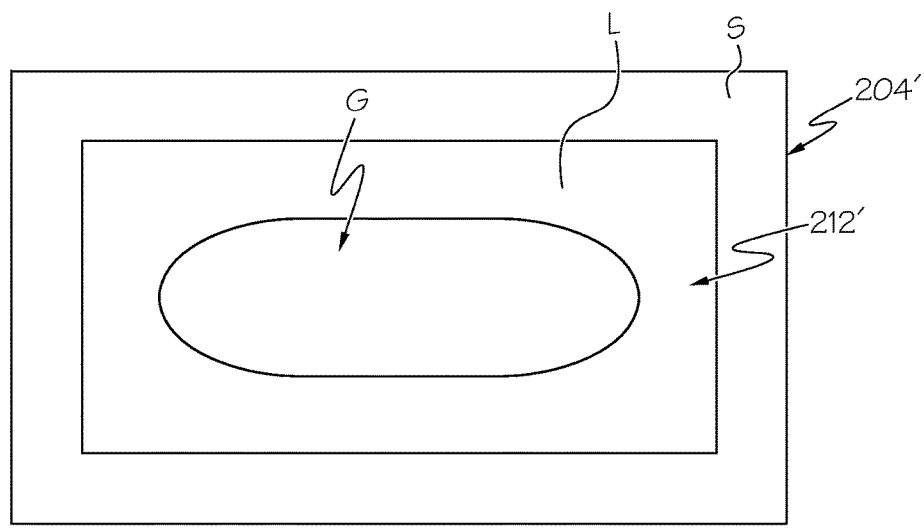
FIG. 3 schematically depicts a top plan view of an alternative example insert of the first bonding assembly of FIG. 1A, according to one or more embodiments shown and described herein.

As shown in FIG. 1A, the insert 204A may include a lip 212 that inwardly extends from an exterior portion of the insert 204A (the exterior portion having an exterior surface S) and includes walls that form the gap G. The lip 212 is disposed below the exterior surface S to form a lip protrusion portion within the interior of the insert 204A. FIGS. 2 and 3 schematically illustrate a top-down view of the example inserts 204, 204' (e.g., insert 204A of FIG. 1A or insert 204C of FIG. 5A as described further below). For example, as shown in FIG. 2, the lip 212 may include a lip surface L that forms a generally rectangular shaped gap G. As another non-limiting example, and as shown in FIG. 3, the lip 212, of the insert 204', may include a lip surface L that form a generally oval shaped gap G, and other shapes and configurations are also possible.

Referring to FIGS. 1A-3, the lip 212 includes lip surfaces L upon which portions of surfaces of substrates 200 and/or 202 are disposed to rest. Any suitable design or shape for the lip surfaces L of lip 212 that shapes gap G to a desired shape capable of holding an amount of tin 206 and metal particles 208 in a form to creates a bond layer 210 (FIG. 1B) as described herein or through conventional high temperature bonding processes are within the scope of this disclosure.

Figure 4A:
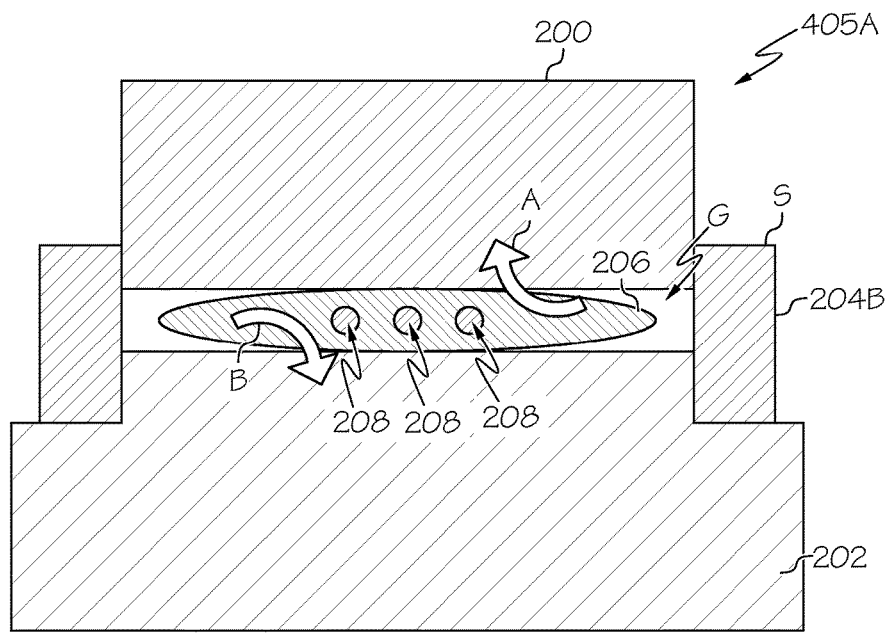
FIG. 4A schematically depicts another first bonding assembly prior to forming a bond layer between a pair of substrates per the method of FIG. 1, according to one or more embodiments shown and described herein.
Figure 4B:
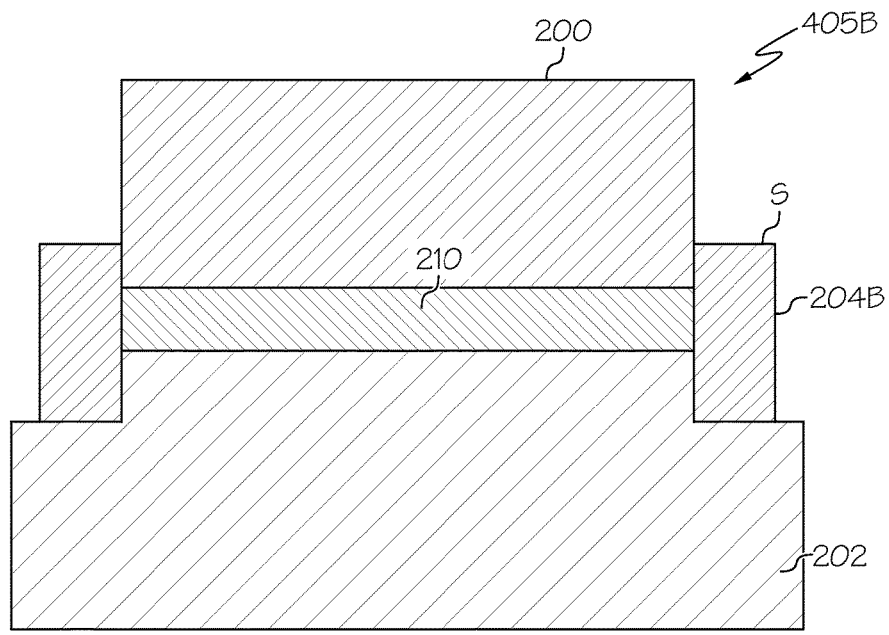
FIG. 4B schematically depicts the another first bonding assembly of FIG. 4A after undergoing the method of FIG. 1, in which the another first bonding assembly has a formed bond layer between the pair of substrates, according to one or more embodiments shown and described herein.

Alternatively, as shown in FIGS. 4A and 4B, the insert 204B may not include a lip 212 but rather may be flush with edges of substrates 200 and 202. For example, assembly 405A shows a top substrate 200 disposed above a bottom substrate 202 with an insert 204B disposed about and flush against a top portion of the bottom substrate 202 and a bottom portion of the top substrate 200. The insert 204B includes a top surface S that has an end abutting against the bottom portion of the top substrate 200 and a bottom surface that abuts against a ledge surface of the bottom substrate 202. Similar to the insert 204A, the insert 204B may be porous or have one or more channels to act as evaporation pathways for an organic solvent, organic binder, and/or flux as described in greater detail further below. After the insert 204B undergoes an example heating method for high temperature bonding of substrates, such as the method shown in FIG. 8, the bonded assembly 405B of FIG. 4B is created as the bond layer 210 between substrates 200, 202 is formed.

Figure 5A:
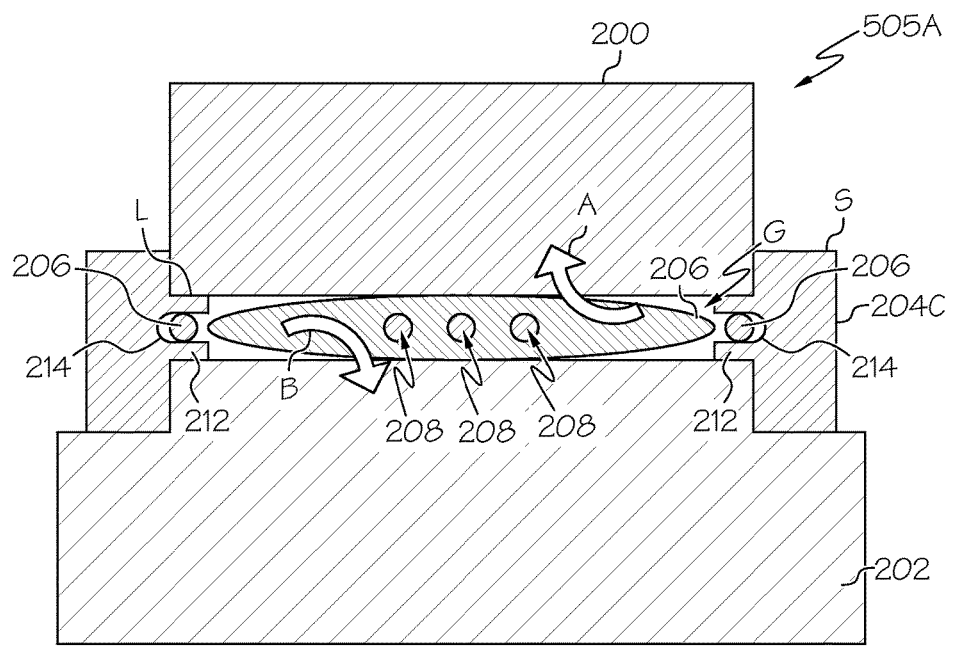
FIG. 5A schematically depicts another first bonding assembly prior to forming a bond layer between a pair of substrates per the method of FIG. 1, according to one or more embodiments shown and described herein.
Figure 5B:
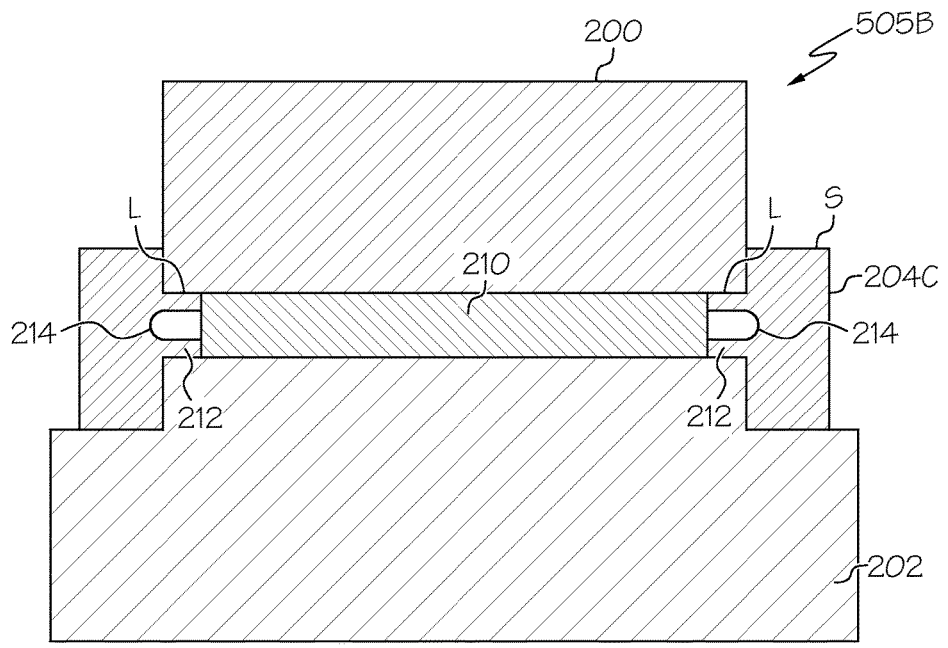
FIG. 5B schematically depicts the first bonding assembly of FIG. 5A after undergoing the method of FIG. 1, in which the yet another first bonding assembly has a formed bond layer between the pair of substrates, according to one or more embodiments shown and described herein.

Additionally or alternatively, as shown in FIGS. 5A and 5B, the insert 204C may include a lip 212 having a slot 214 that may retain tin 206 (FIG. 5A). For example, assembly 505A shows a top substrate 200 disposed above a bottom substrate 202 with a portion of an insert 204C disposed about and flush against a top portion of the bottom substrate 202 and a bottom portion of the top substrate 200. The insert 204C includes a top surface S that has an end abutting against the bottom portion of the top substrate 200 and a bottom surface that abuts against a ledge surface of the bottom substrate 202. The insert 204C further includes a lip 212 having lip surface L and extending into a space between substrates 200, 202. The lip 212 includes a slot 214 that is shaped to hold tin 206, for example. Similar to inserts 204A-204B, the insert 204C may be porous or have one or more channels to act as evaporation pathways for an organic solvent, organic binder, and/or flux as described in greater detail further below. After the insert 204C undergoes an example heating method for high temperature bonding of substrates, such as the method shown in FIG. 8, the bonded assembly 505B of FIG. 5B is created as the bond layer 210 between substrates 200, 202 is formed.

The amount of tin 206 and the amount of metal particles 208 may depend on the desired application and properties for the resulting bond layer. As a non-limiting example, the amount of tin 206 may include a weight percent of 70% Sn, and the amount of the plurality of metal particles 208 may include a weight percent of 30%. The plurality of metal particles may be Ni, Cu, Al, Ag, or like metal materials, such as metal magnetic materials, alone or in combinations thereof. In embodiments, the material of the metal particles 208 may comprise at least about 30 wt % copper, at least about 30 wt % nickel, at least about 30 wt % silver, at least 30 wt % aluminum, and/or a 30 wt % mixture of Ni, Cu, Al, and/or Ag. In other embodiments, the material of the metal particles 208 (e.g., Ni, Cu, Al, Ag, other suitable like metal materials, or any combination thereof) includes a weight percent of in the range of about 20% to about 40%, and the tin (Sn) 206 comprises a respective weight percent in the range of about 80% to about 60%. In embodiments, the material of the metal particles 208 may comprise Ni, Cu, Al, and/or Ag and be in a range of at least about 20 wt % to at least about 40 wt %. For example, the amount of tin 206 may include a weight percent of 60% Sn, and the amount of the plurality of metal particles 208 may include a weight percent of 40% Ni. Or the amount of tin 206 may include a weight percent of 60% Sn, and the amount of the plurality of metal particles 208 may include a weight percent of 40% Cu. Or the amount of tin 206 may include a weight percent of 80% Sn, and the amount of the plurality of metal particles 208 may include a weight percent of 20% Ag.

The tin 206 has a low melting temperature that is lower than the melting temperature of the metal particles 208. Tin has a melting point in the range of about 230° C. to about 260° C. Accordingly, the assembly 205 may be heated to temperature approximately the low melting temperature of tin, or rather, be heated to a range of about 250° C. to 300° C. or about 230° C. to about 260° C. such that the tin within the assembly 205 melts. The metal particles have a high melting temperature that is greater than the low melting temperature of the tin. Thus, during the example heating processes and methods described below, when the tin 206 is heated up to its melting temperature to eventually melt to create a solder that will coat the metal particles 208, the metal particles 208 themselves do not melt and create a solder.

Referring once again to FIG. 8, in block 804, the assembly 105A is heated during a first heating to a first temperature that is below the low melting temperature of tin 206. The first heating, as well as other heatings described herein, may be part of a transient liquid phase (TLP) heating or soldering or a diffusion soldering process as conventionally known.

In block 806, the assembly 105A is held at the first temperature for a first period of time. As examples and not as limitations, the first temperature may be in the range of about 170° C. to about 180° C. The first period of time may be approximately equal to or about 5 minutes. By holding the assembly 105A at the first temperature for a first period of time, a substantial amount of paste that may be present in the assembly 105A may be evaporated or vaporized.

As stated above, the metal particles 208 are positioned between the top substrate 200 and the bottom substrate 202. The plurality of metal particles 208, for example, may be configured as loose particles in the form of a powder. In such embodiments, the powder may be positioned on surfaces of the top substrate 200 and the bottom substrate 202 such that the powder is disposed between substrates 200 and 202. In other embodiments, the plurality of metal particles 208 provided in a paste including an organic binder, such that the plurality of metal particles 208 is disposed in the organic binder. The organic binder may be an organic ingredient as understood by those skilled in the art that is used to bind together two or more materials. In a non-limiting example, the paste may be deposited on adjacent surfaces of top substrate 200 and bottom substrate 202. The paste alternatively may include a flux component, at least one of tin 206 and the plurality of metal particles 208, and an organic solvent (i.e., having a viscosity which is less than a viscosity associated with an organic binder).

In embodiments in which the metal particles 208 are provided in a paste, the step of holding of the assembly 105A at the first temperature (e.g., block 806 of FIG. 1) vaporizes or evaporates the non-metallic particle containing portion (such as an organic binder or solvent) of the paste. Thus, substantially no organic binder from the paste will be present to impede the path of tin solder from tin 206 onto the plurality of metal particles 208 to form intermetallic bonds after the second heating to a second temperature (e.g., block 808 of FIG. 8) and the second period of time holding at the second temperature (e.g., block 810 of FIG. 8), as described in greater detail below.

In block 808, the assembly 105A is heated during a second heating to a second temperature that is approximately to the low melting temperature of the tin 206 such that the tin 206 is drawn and consumed into a bond layer 210 disposed between substrates 200, 202. The drawing action may occur via a capillary force such that Sn is drawn inside and consumed into the bond layer. In embodiments, and referring to FIGS. 1A, 4A, and 5A, the tin 206 is drawn in directions of A and B and wets the plurality of metal particles 208. In block 810, the assembly 105A is held at at least the second temperature for a second period of time such that the amount of tin 206 and the amount of metal particles 208 form intermetallic bonds. Thus, the assembly is held at a holding temperature for the second period of time, where the holding temperature is equal to or greater than the second temperature. For example, if the assembly 105A is heated to a second temperature in block 108 that is approximately the low melting temperature, such as the melting temperature of tin, in block 810 the assembly 105A may be held at the second temperature for a second period of time such as in the range of about 5 minutes to about 10 minutes to allow capillary forces assist with the action of drawing Sn into an eventual bond layer.

As an example and not a limitation, the second temperature may be in the range of about 230° C. to about 260° C. or in the range of about 250° C. to about 300° C. As another non-limiting example, the second temperature may be approximately equal to 230° C. or approximately equal to 250° C. As a non-limiting example, the second period of time may be in the range of about 30 minutes to about 60 minutes.

As another example, after the assembly 105A is heated during the second heating to the second temperature that is approximately equal to the low melting temperature of the tin 206, the assembly 105A may continue to be heated to a holding temperature that is a greater than the low melting temperature of the tin 206. Thus, in block 810, the assembly 105A is held at the holding temperature, which is at least the second temperature or higher, such that the assembly 105A is held at at least the second temperature. If the holding temperature is greater than the second temperature, between blocks 808 and 810, the assembly 105A may be heated to the holding temperature in a continuous heating or in a ramped-up, incremental heating.

Figure 9:
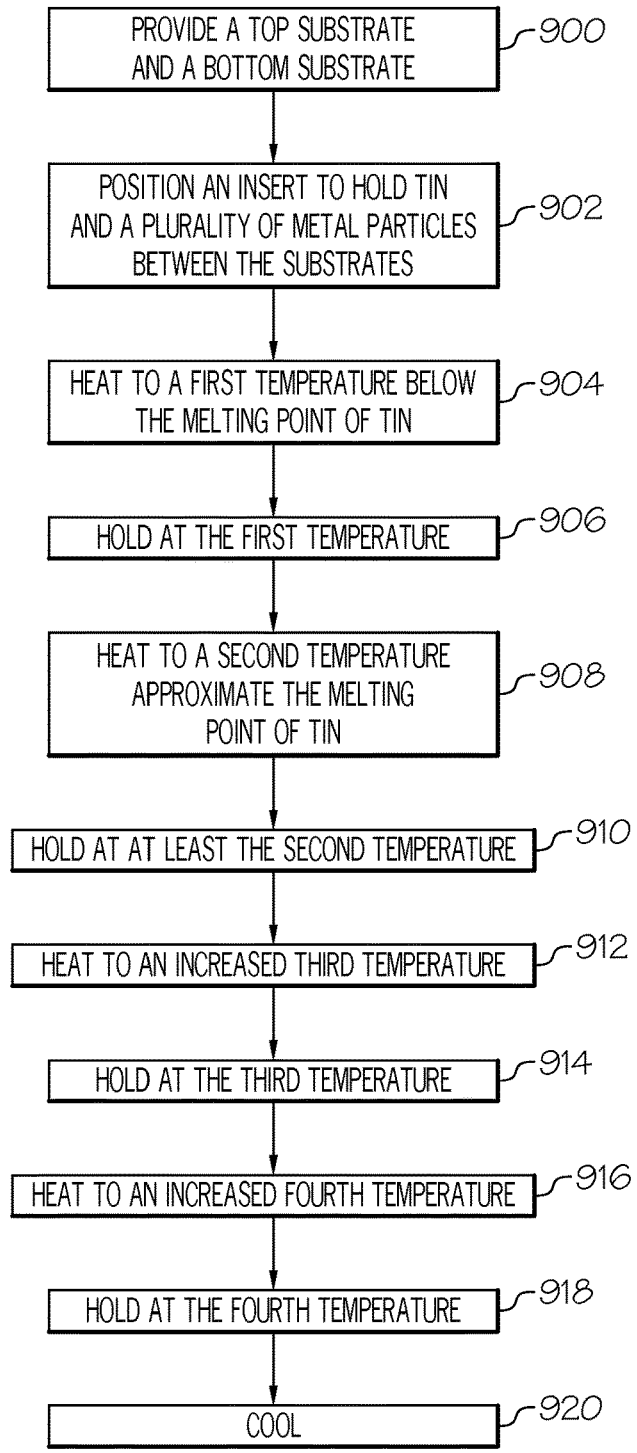
FIG. 9 depicts a flow chart of another multi-step method for high temperature bonding of substrates, according to one or more embodiments shown and described herein.

FIG. 9 shows an example of an incremental heating method that will be described in greater detail below with respect to FIGS. 6A-6F. In FIG. 9, blocks 900-910 and 920 respectively parallel blocks 800-810 and 812 of FIG. 8, and blocks 912-918 of FIG. 9 outline further incremental heating steps. For example, prior to the cooling step of the block 812 of FIG. 8 (or respective block 920 of FIG. 9) as described below, the assembly 105A may be increased to a third temperature (i.e., in block 912) that is slightly higher than the second temperature and held for a third period of time (in block 914) to assist to fill gap G with tin 206. The third temperature may be, for example, in the range of about 250° C. to about 270° C., and the third period of time may be in the range of about 5 minutes to about 10 minutes. Then, the assembly 105A may be increased to a fourth temperature (in block 916) that is slightly higher than the third temperature (and that may be equal to the holding temperature). The assembly 105 may then (in block 918) held at the fourth temperature for the second period of time to, for example, form a bond layer 210 via a reaction between the amount of tin 206 and the amount of metal particles 208 that form intermetallic bonds. The fourth temperature may be, for example, in the range of about 290° C. to about 300° C., and the second period of time may be in the range of about 30 minutes to about 40 minutes or about 30 minutes to about 60 minutes.

Figure 10:
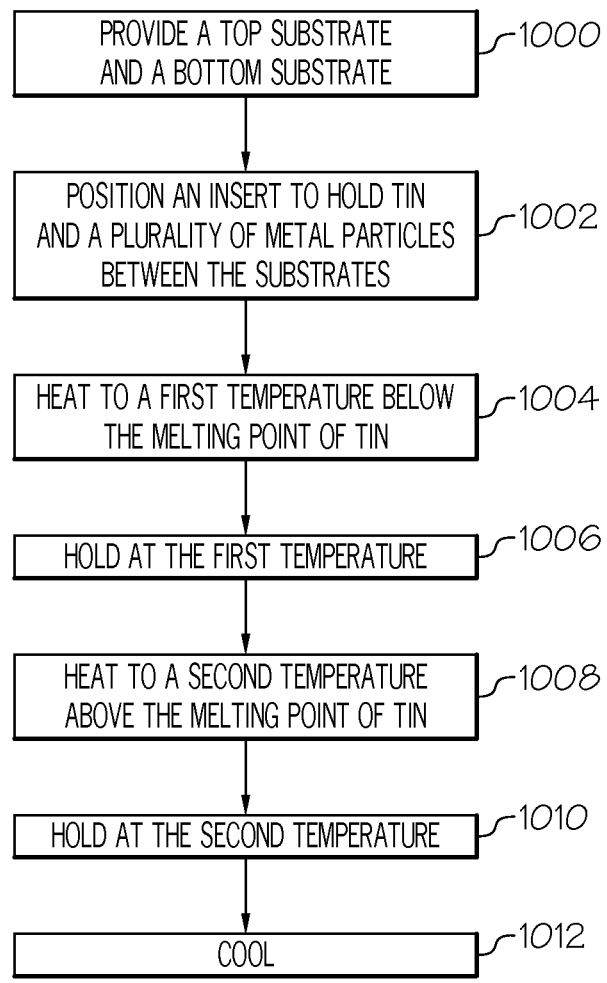
FIG. 10 depicts a flow chart of another multi-step method for high temperature bonding of substrates, according to one or more embodiments shown and described herein.

FIG. 10 shows an alternative method (that is described in greater detail below with respect to FIGS. 7A-7G) in which blocks 1000-1006 respectively parallel blocks 800-806 of FIG. 8. However, in block 1008, and after holding an assembly such as the assembly 105A at the first temperature, the assembly may be continuously heated up to a second temperature that is above the melting point of tin (in block 1010) and held at the second temperature (in block 1010) prior to being cooled (in block 1012).

Figure 11:
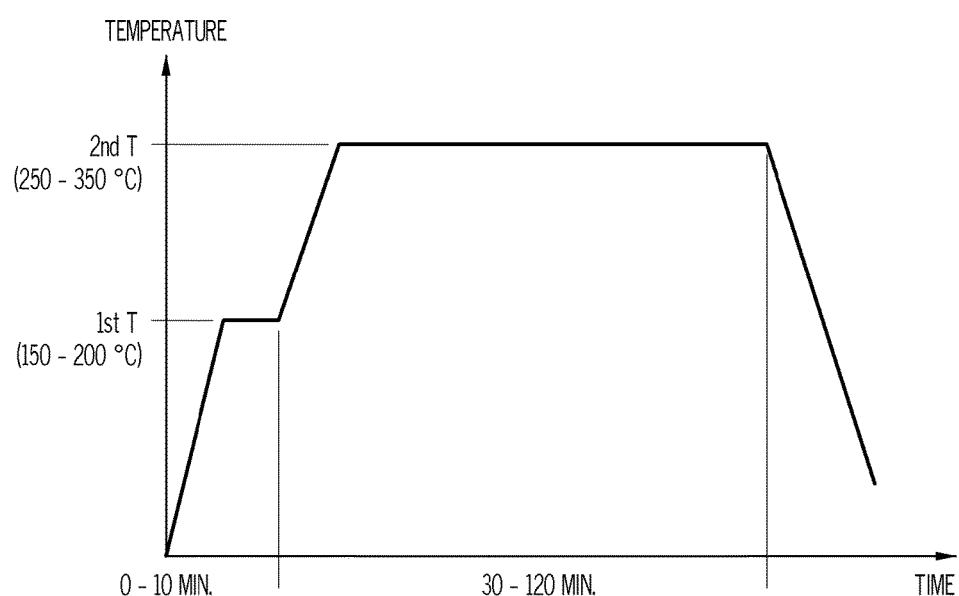
FIG. 11 graphically depicts a temperature profile employable for one or more embodiments described and illustrated herein.

FIG. 11 graphically depicts a heating process in which an example bonding assembly, as according to one or more of the embodiments described herein, is heated within the first 10 minutes to a first holding temperature in the range of about 150° C. to about 200° C. For example, the bonding assembly may take about 5 minutes to heat to the first holding temperature range, and then the bonding assembly may be held at the first holding temperature range for about 5 minutes. Then, as set forth in FIG. 10, the bonding assembly may be heated to a second holding temperature in the range of about 250° C. to about 350° C. and be held for a period in a range of about 30 minutes to about 120 minutes. For example, the bonding assembly may be ramped up to the second holding temperature range within a period of from about 5-10 minutes. Alternatively, as set forth in FIG. 9, the second holding temperature range may be incrementally ramped up to the second holding temperature range and held for periodic incremental periods. The bonding assembly may then be cooled (as set forth in FIGS. 8-10) to create a bonded assembly.

Figure 1B:
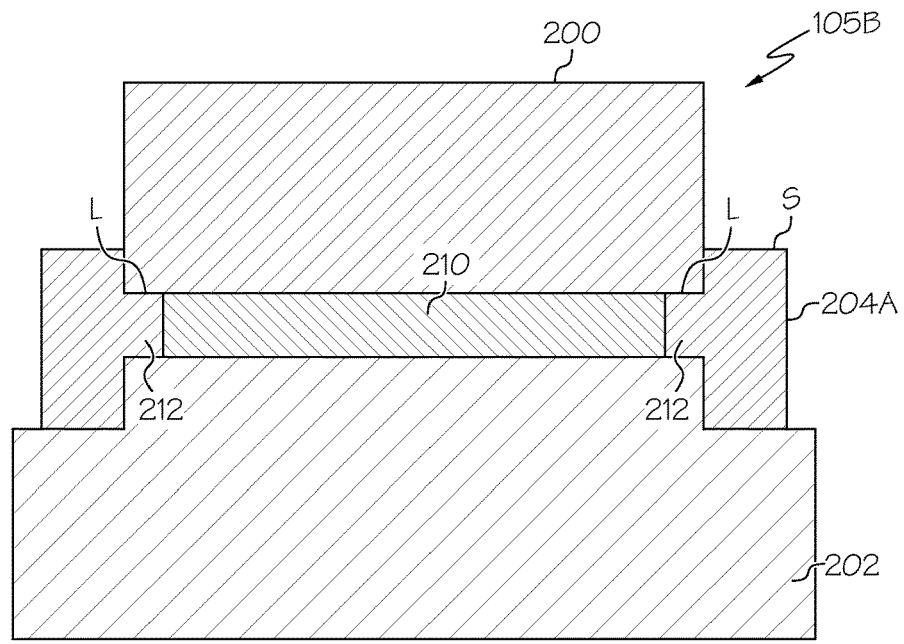
FIG. 1B schematically depicts the first bonding assembly of FIG. 2A after undergoing the method of FIG. 1, in which the first bonding assembly has a formed bond layer between the pair of substrates, according to one or more embodiments shown and described herein.

Referring once again to FIG. 8 and the example assembly 105A of FIG. 1B, in block 812, the assembly 105A is cooled to create a bonded assembly 105B as shown in FIGS. 1B. Block 812 may similarly be applied create bonded assembly 405B of FIG. 4B or bonded assembly 505B of FIG. 5B. The thickness of the bond layer may depend on the application and is not limited by this disclosure. In embodiments, and referring once again to FIG. 1B as an example, the bond layer 210 of the bonded assembly 105B has a thickness in the range of about 10 μm to about 250 μm after cooling as set forth in block 812. In embodiments, the bond layer 210 may have a thickness that is at least about 10 microns (μm), at least about 20 microns, at least about 50 microns, at least about 100 microns, at least about 200 microns, or even at least about 250 microns. In additional embodiments, the thickness of the bond layer 210 may be less than about 250 microns, less than about 200 microns, less than about 100 microns, less than about 50 microns, less than about 20 microns, or even less than about 10 microns.

While the inserts 204A-204C of FIGS. 1A, 4A, and 5A described above depict embodiments in which a gap G is shaped to hold both tin 206 and the metal particles 208, each of which may be held as either a paste or powder, in alternative embodiments, such as those described below with respect to FIGS. 6A-7G, one or more walls of an example porous insert may be shaped to hold tin 206. For example, the gap G of insert 204D of FIGS. 6A-6F is shaped to hold an organic binder including the metal particles 208 while the insert 204D initially holds the tin 206. Thus, FIGS. 6A-6F depict an alternative embodiment of a bonded substrate assembly 605F, which is also formed through an alternative method as described in FIG. 9, as described below. It should be understood, however, that other heating methods described herein may be applied to assemblies 605A-605F as shown in respective FIGS. 6A-6F.

Figure 6A:
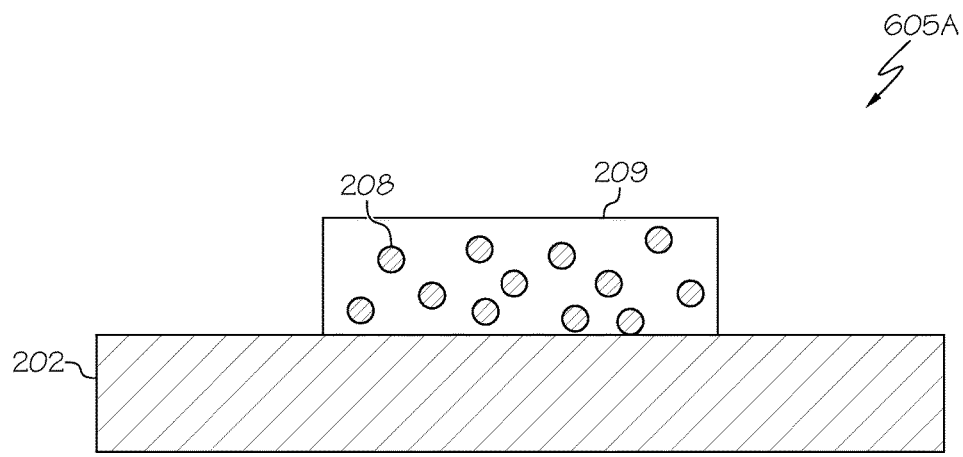
FIGS. 6A-6E schematically depict another first bonding assembly prior to forming a bond layer between a pair of substrates, according to one or more embodiments shown and described herein.
Figure 6B:
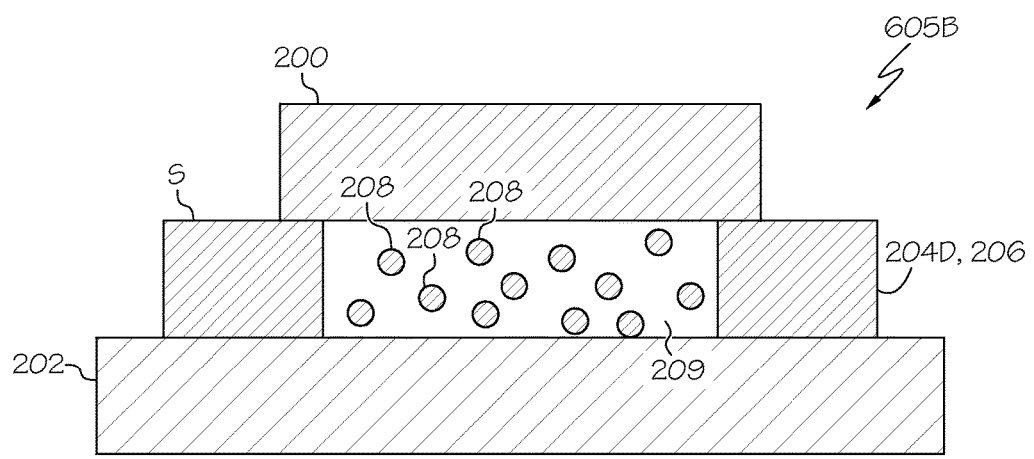

FIG. 6A shows an assembly 605A including a binder 209, which may be a stencil paste, for example, that includes the metal particles 208. The binder 209 including the metal particles 208 is disposed atop a bottom substrate 202. In FIG. 6B, showing assembly 605B, a top substrate 200 and an insert 204 are respectively disposed atop and around the binder 209. The insert 204 includes a low melting point material that may be, for example, tin 206. The insert 204 includes a top surface S that has an outer exposed portion and an inner portion disposed between surfaces of substrates 200 and 202. Thus, a top substrate 200 and a bottom substrate 202 are provided (i.e., block 900 of FIG. 9), and an insert holding tin 206 and a plurality of metal particles 208 (in an organic binder) are positioned between the substrates (block 902).

Figure 6C:
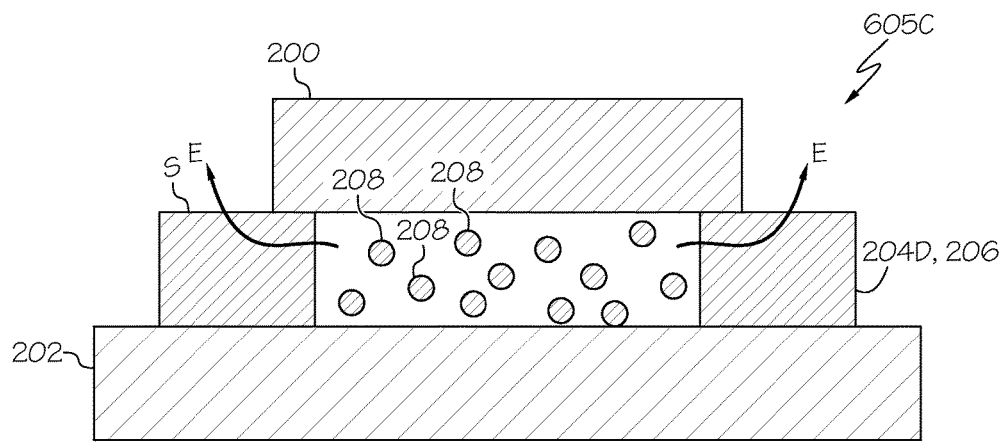

FIG. 6C shows assembly 605C in which heat is applied to the assembly 605C to a temperature below a melting point of the low melting point material as set forth in block 904 (i.e., below the melting point of tin 206) and held at the temperature (block 906) such that the binder 209 evaporates completely or substantially completely. For example, the binder 209 may evaporate through an evaporation pathway in the direction of arrow E through one or more porous pathways and/or channels of the insert 204. Evaporation of the binder 209 from the area of gap G of the insert 204 may permit the avoidance of voids that may otherwise form within a resulting bonding layer 210. As a non-limiting example, the temperature of the applied heat may be in the range of about 170° C. to about 180° C. The temperature may be held for a period of time that may be approximately 5 minutes.

Figure 6D:
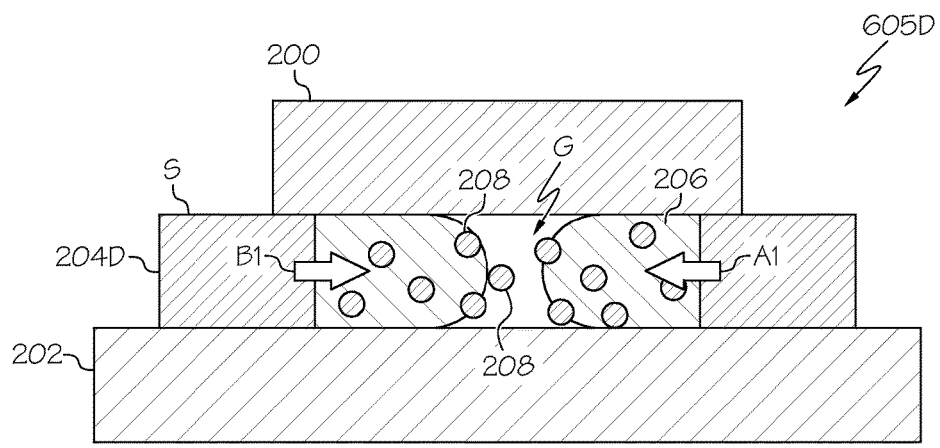

In block 908, the assembly 605D is heated to a second temperature that is approximately the melting point of tin 206. FIG. 6D shows assembly 605D in which the melting point of tin is reached and the tin is melted while the assembly 605D is held for a period of time (block 910). For example, tin 206 is melted and drawn into a gap G by capillary forces in the direction of arrows A1 and B1 after the melting point temperature of tin 206 is reached. As an example and not a limitation, the temperature reached in FIG. 6D may be in the range of about 230° C. to about 260° C. In embodiments, the period of time at which the temperature is held may be in the range of about 5 minutes to about 10 minutes.

Figure 6E:
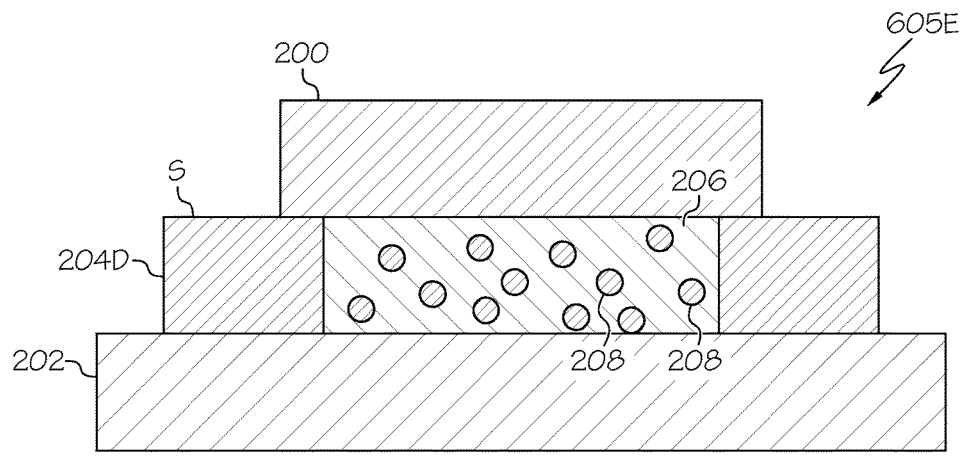

In block 912-914 of FIG. 9, with respect to the assembly 605E of FIG. 6E, the temperature is heated and held at slightly higher than the melting point of the tin 206 until the tin 206 substantially fills the gap G. Tin 206 substantially fills in the gap G of FIG. 605D to arrive at the assembly 605E shown in FIG. 6E in which the metal particles 208 are present and intermixed with the tin 206. The temperature may be held at, for example, a temperature in the range of about 250° C. to about 270° C. for a holding time of about 5 to about 10 minutes.

Figure 6F:
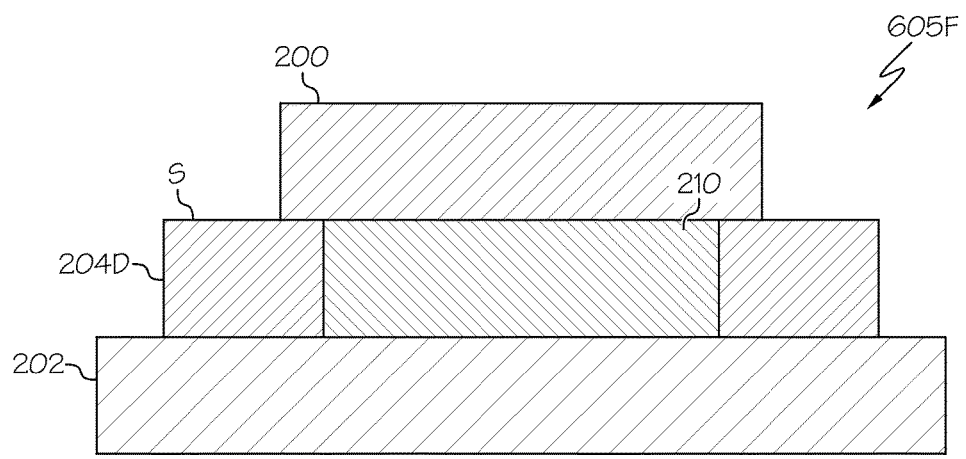
FIG. 6F schematically depicts the first bonding assembly of FIGS. 6A-6E after undergoing the alternative method, in which the first bonding assembly has a formed bond layer between the pair of substrates, according to one or more embodiments shown and described herein.

With respect to blocks 916-918, the temperature may then be increased to a higher temperature and held to cause a reaction between the low melting point material (such as tin 206, that may have a melting temperature in the range of about 230° C. to about 260° C.) and the high melting point material (of the metal particles 208) to form a bond layer 210 as shown in assembly 605F of FIG. 6F. This reaction causes the formation of the bond layer 210 by creation of one or more intermetallic bonds or alloys formed between the intermixed and heated tin 206 and metal particles 208. In embodiments, the period of time at which the temperature is held to create the bond layer 210 may be in the range of about 30 minutes to about 60 minutes. As a non-limiting example, the temperature may be held in the range of about 290° C. to about 300° C. during this period of time. When formed, as by the methods described herein, the bond layer 210 bonds the two substrates 200, 202 together.

While FIGS. 6A-6F depict an embodiment in which a gap G of the insert 204D is shaped to hold an organic binder including the metal particles 208 while the insert 204D initially holds the tin 206, the gap G may instead be shaped to hold a dry powder including the metal particles 208 while the insert 204G is porous and shaped to initially hold the tin 206, an organic solve, and a flux. For example, FIGS. 7A-7G depict another alternative embodiment of a bonded substrate assembly 705G formed through an alternative method, which may be, for example, the method of FIG. 10. It should be understood, however, that other methods described herein, including those incorporating a temperature profile as shown graphically in FIG. 11, may be applied to assemblies 705A-705G as shown in respective FIGS. 7A-7G.

Figure 7A:
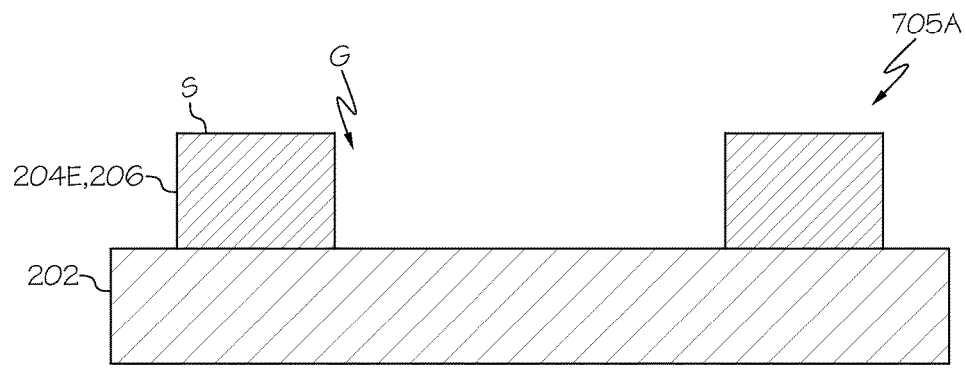
FIGS. 7A-7F schematically depict first bonding assembly prior to forming a bond layer between a pair of substrates, according to one or more embodiments shown and described herein.
Figure 7B:
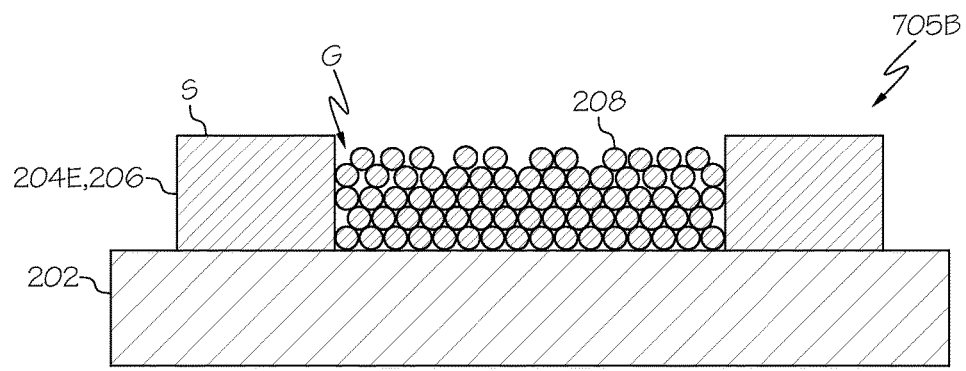
Figure 7C:
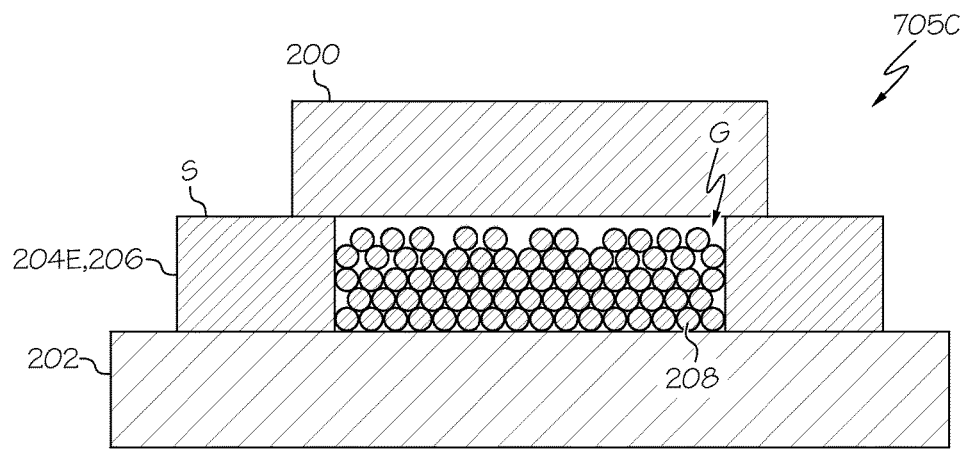

FIG. 7A shows an assembly 705A including an insert 204E that is disposed atop a bottom substrate 202 and that defines a gap G. In the illustrated embodiment, the insert 204E is porous and includes a low melting temperature material, such as tin 206. The tin 206 may be provided in a paste further including an organic solvent (i.e., having a viscosity less than the viscosity of an organic binder) and flux. In FIG. 7B, showing assembly 705B, dry metal particles 208 of a high melting point material are disposed in the gap G of the insert 204E. In FIG. 7C, a top substrate 200 is disposed atop the insert 204E, forming assembly 705C. The insert 204 includes a top surface S that has an outer exposed portion and an inner portion disposed between surfaces of substrates 200 and 202. Thus, a top substrate 200 and a bottom substrate 202 are provided (i.e., block 900 of FIG. 9), and an insert holding tin 206 and a plurality of metal particles 208 (as a dry powder, for example) are positioned between the substrates (block 902).

Figure 7D:
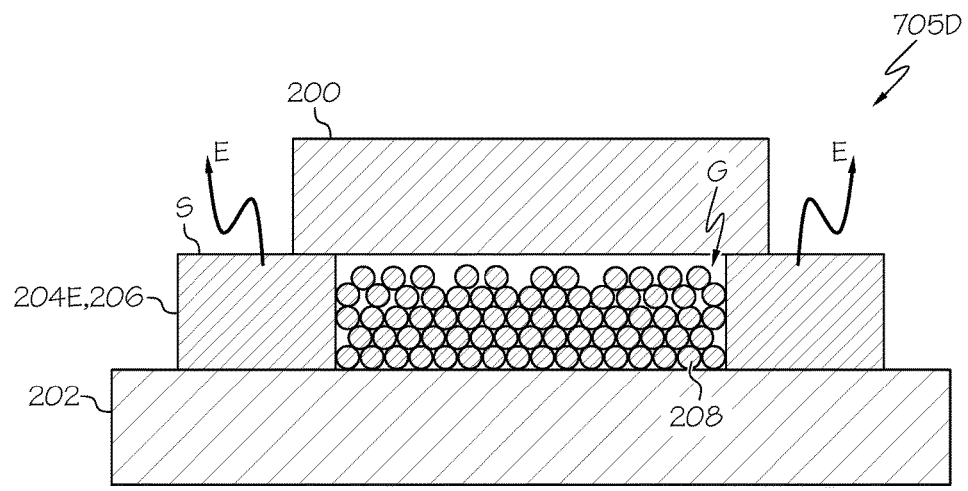

As set forth in block 1004, FIG. 7D shows assembly 705D in which heat is applied to the assembly 705D to a temperature below a melting point of the low melting point material (i.e., below the melting point of tin 206) and held (block 1006) such that the paste material of the insert 204E evaporates completely or substantially completely in, for example, a direction of arrows E. As a non-limiting example, the temperature of the applied heat may be in a range of about 150° C. to about 200° C. (as shown in the temperature profile graph of FIG. 8) or the range of about 170° C. to about 180° C. The temperature may be held for a period of time that may be approximately 5 minutes.

Figure 7E:
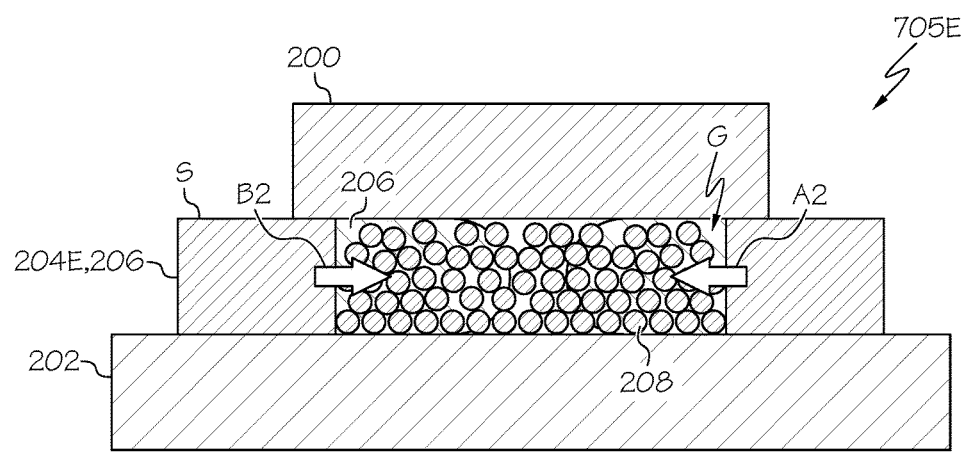

As set forth in blocks 1008-1010, the assembly 705E is then heated to a second temperature above the melting point of tin (i.e., heated to and passing the melting point of tin) and held at the temperature. FIG. 7E shows assembly 705E in which the melting point of the tin is reached and the tin is substantially melted. For example, tin 206 is melted and drawn into the gap G housing the particles 208 by capillary forces in the direction of arrows A2 and B2 after the melting point temperature of tin 206 is reached. As an example and not a limitation, the temperature reached in FIG. 7E may be in a range of about 250° C. to about 350° C. (as set forth in block 1008 and as shown in the temperature profile graph of FIG. 11). Alternatively, the temperature reached in FIG. 7E may be in the range of about 230° C. to about 260° C. (i.e., as set forth in block 808 of the example process of FIG. 8). In embodiments, the period of time at which the temperature is held may be in a range of about 30 minutes to about 120 minutes (as shown in the temperature profile graph of FIG. 11). In alternative embodiments, the period of time may be in the range of about 5 minutes to about 10 minutes if, for example, the temperature is to be incrementally increased (such as by a process set forth in FIG. 9) and further held prior to forming a final bond layer 210 of FIG. 7G.

Figure 7F:
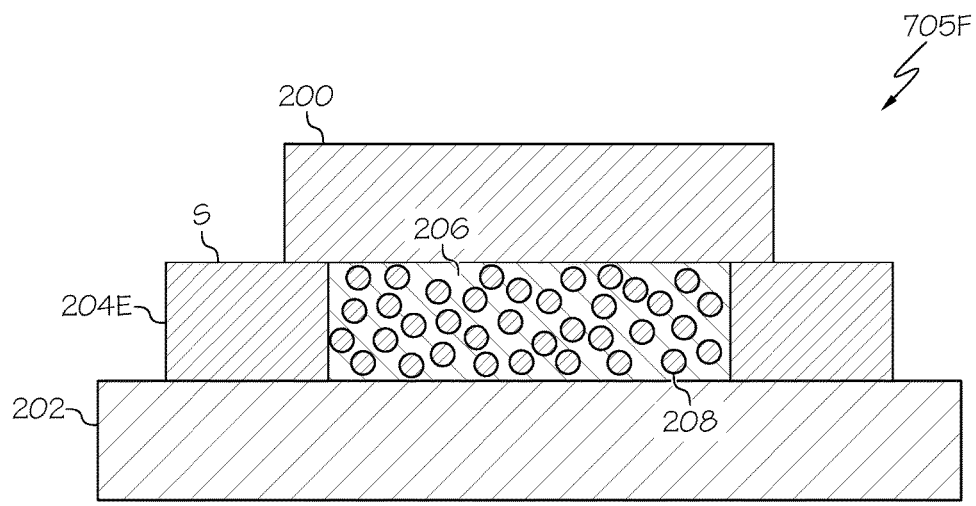

With respect to the assembly 705F of FIG. 7F and block 1010 of FIG. 10, for example, the temperature is held at slightly higher than the melting point of the low melting point material (i.e., tin 206) until the tin 206 substantially fills the insert gap G to arrive at the assembly 705F in which the metal particles 208 are present and intermixed with the tin 206. The temperature may be held at, for example, a temperature in the range of about 250° C. to about 270° C. for a holding time of about 5 to about 10 minutes.

Figure 7G:
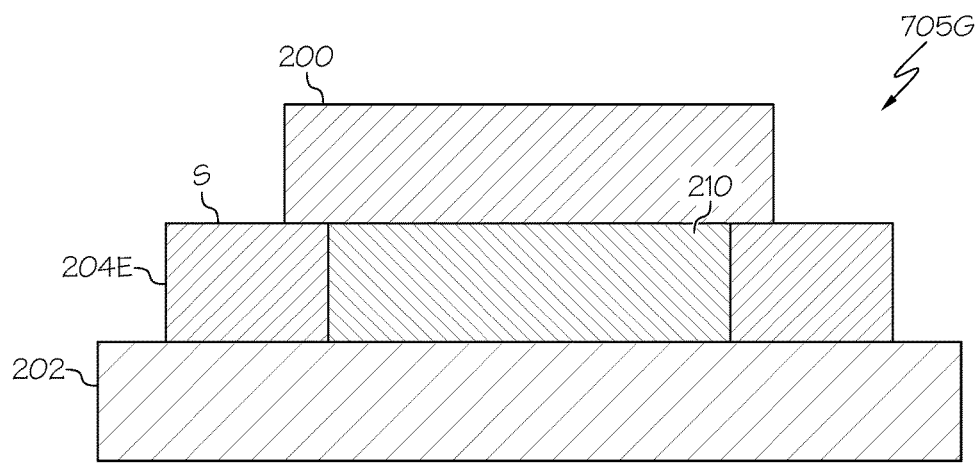
FIG. 7G schematically depicts the first bonding assembly of FIGS. 7A-7F after undergoing the alternative method, in which the first bonding assembly has a formed bond layer between the pair of substrates, according to one or more embodiments shown and described herein.

The temperature may further be increased to a higher temperature and held to cause a reaction between the low melting point material (such as tin 206, that may have a melting temperature in the range of about 230° C. to about 260° C.) and the high melting point material (of metal particles 208) to form a bond layer 210 as shown in assembly 705G of FIG. 7G. This reaction causes the formation of the bond layer 210 by creation of one or more intermetallic bonds or alloys formed between the intermixed and heated tin 206 and metal particles 208. In embodiments, the period of time at which the temperature is held to create the bond layer 210 may be in the range of about 30 minutes to about 60 minutes. As a non-limiting example, the temperature may be held in the range of about 250° C. to about 300° C. during this period of time. When formed, as by the methods described herein, the bond layer 210 bonds the two substrates 200, 202 together.

As an example and not a limitation, insert 204A-E of FIGS. 1A-7G is reusable. For example, any one of inserts 204A-E may be used with an additional bonding assembly that is created via the example process set forth in FIGS. 8-11 and described herein. Additionally or alternatively, an array of multiple top and bottom substrates 200 and 202 may be used with selected ones of inserts 204A-E disposed therebetween to form or create a set of mass producible and multiple bonded assemblies (such as inserts 204A to create multiple bonded assemblies 105B) by the example methods described herein such as the one depicted in FIG. 1. In embodiments, inserts 204 may be formed of multiple adjoining parts, such as two half parts connected together, so to be laterally released from different sides of a pair of bonded substrates (for example, this allows a lateral release of the insert 204 should the bond layer 210 form within slots 214 of the insert 204).

It should now be understood that embodiments described herein are directed to methods for high temperature bonding of substrates to develop a strengthened bonding or bond layer between two bonded two substrates. The bond layer is formed utilizing, in some embodiments, a multi-step process that incrementally heats and holds the substrates at increasing temperatures. In some embodiments, paste that may be used to initially releasably but adhesively join the two substrates together is evaporated after a first heating and holding step. In a second heating and holding step, tin solder may freely coat metal particles without an impedance or restriction to this coating path that a present paste might otherwise present. In other embodiments, capillary forces draws and consumes tin solder as tin is melted into a bond layer formed between two substrates being bonded in an example high temperature bonding process. The example methods described herein result in a strengthened bond layer between two bonded substrates that may be used to bond semiconductor devices in power electronics applications, for example.

It is noted that the terms "substantially" and "about" and "approximately" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for bonding of substrates, the method comprising:
  providing a top substrate and a bottom substrate;
  positioning an insert between the top and bottom substrates to form an assembly, wherein:
    the insert is positioned around at least a portion of the top substrate and comprises at least one of a porous material and one or more channels;
    the insert comprises a gap that is shaped to be disposed between the top and bottom substrates and that is configured to hold a plurality of metal particles having a metal particle melting temperature, wherein at least one of the insert and the gap holds an amount of Sn having a Sn melting temperature; and
    the metal particle melting temperature is greater than the Sn melting temperature;
  heating the assembly during a first heating to a first temperature that is below the Sn melting temperature;
  holding the assembly at the first temperature for a first period of time;
  heating the assembly during a second heating to a second temperature that is approximately equal to the Sn melting temperature;

holding the assembly at a holding temperature for a second period of time such that the amount of Sn and the amount of the plurality of metal particles form one or more intermetallic bonds, wherein the holding temperature is equal to or greater than the second temperature; and cooling the assembly to create a bonded assembly.

2. The method of claim 1, further comprising positioning a paste between the top and bottom substrates, wherein:
the paste comprises an organic binder;
the amount of the plurality of metal particles is disposed in the paste; and
heating the assembly during the first heating and holding the assembly at the first temperature for the first period of time further comprises vaporizing the paste.

3. The method of claim 1, wherein the insert is porous, and the method further comprises positioning a powder containing the plurality of metal particles in the gap of the insert, and disposing a paste comprising a solvent, flux, and the amount of Sn within one or more pores of the insert.

4. The method of claim 1, further comprising positioning a powder on surfaces of the top and bottom substrates such that the powder is disposed between the top and bottom substrates, wherein the amount of the plurality of metal particles is disposed in the powder.

5. The method of claim 1, wherein:
heating the assembly during the second heating to the second temperature that is approximately equal to the Sn melting temperature comprises drawing Sn into a bond layer between the top and bottom substrates via a capillary force such that Sn is drawn inside and consumed into the bond layer;
Sn wets the plurality of metal particles; and
the bond layer has a thickness in a range of about 10 μm to 250 μm after cooling.

6. The method of claim 1, wherein the top substrate comprises a die made of Si or SiC.

7. The method of claim 1, wherein the bottom substrate comprises direct bonded copper or direct bonded aluminum.

8. The method of claim 1, wherein:
the insert comprises graphite or stainless steel and is circular; and
the insert comprises a thickness in a range of about 1 mm to 2 mm.

9. The method of claim 1, wherein the at least an amount of Sn comprises a weight percent of 70% Sn and the amount of the plurality of metal particles comprises a weight percent of 30% Ni.

10. The method of claim 1, wherein each metal particle comprises a material that is selected from at least one of a group consisting of Ni, Cu, Ag, and Al.

11. The method of claim 10, wherein the least an amount of Sn comprises a weight percent of 70% Sn and the amount of the plurality of metal particles comprises a weight percent of 30% of the material that is at least one of a group selected from Ni, Cu, Ag, and Al.

12. The method of claim 1, wherein each of heating the assembly during the first heating and the second heating comprises undergoing one of a transient liquid phase heating or a diffusion soldering.

13. The method of claim 1, wherein, after heating the assembly during a second heating to a second temperature that is approximately equal to the Sn melting temperature, further comprising:
holding the assembly at the second temperature for a first intermediary period of time in a range of about 5 minutes to about 10 minutes;
heating the assembly during a third heating to a third temperature that is greater than the Sn melting temperature;
holding the assembly at the third temperature for a second intermediary period of time in a range of about 5 minutes to about 10 minutes;
heating the assembly during a fourth heating to the holding temperature that is greater than the third temperature; and
holding the assembly at the holding temperature for the second period of time that is in a range of about 30 minutes to about 40 minutes.

14. The method of claim 1, further comprising using an array of top and bottom substrates with inserts disposed between each respective top and bottom substrate and applying the providing through cooling steps to create a set of mass producible bonded assemblies.

15. The method of claim 1, wherein:
the first temperature is in a range of about 170° C. to about 180° C.; and
the first period of time is approximately 5 minutes.

16. The method of claim 1, wherein:
the third temperature is in a range of about 250° C. to about 300° C.; and
the second period of time is in a range of about 30 minutes to 60 minutes.

* * * * *